US010692825B2

(12) United States Patent
Chuang et al.

(10) Patent No.: US 10,692,825 B2
(45) Date of Patent: Jun. 23, 2020

(54) LIGHT-EMITTING CHIP PACKAGE

(71) Applicant: HLJ TECHNOLOGY CO., LTD., Hsinchu County (TW)

(72) Inventors: Chih-Hung Chuang, Hsinchu County (TW); Jen-Hsiang Yang, Hsinchu County (TW)

(73) Assignee: HLJ TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/277,784

(22) Filed: Feb. 15, 2019

(65) Prior Publication Data

US 2019/0260180 A1    Aug. 22, 2019

(30) Foreign Application Priority Data

Feb. 21, 2018 (TW) .............................. 107105773 A

(51) Int. Cl.
| | | |
|---|---|---|
| *H01L 31/00* | (2006.01) |
| *H01L 21/00* | (2006.01) |
| *H01L 23/00* | (2006.01) |
| *H01L 33/60* | (2010.01) |
| *H01L 33/62* | (2010.01) |

(52) U.S. Cl.
CPC .............. *H01L 24/00* (2013.01); *H01L 33/60* (2013.01); *H01L 33/62* (2013.01); *H01L 2933/0066* (2013.01)

(58) Field of Classification Search
CPC ..................................................... H01L 33/62
USPC ............................. 438/42–44; 257/397, 466
See application file for complete search history.

(56) References Cited

U.S. PATENT DOCUMENTS

| | | | | |
|---|---|---|---|---|
| 8,048,700 B2* | 11/2011 | Tanaka | .................. | H01S 5/0224 |
| | | | | 438/46 |
| 8,659,105 B2* | 2/2014 | Takeshita | .......... | H01L 27/14618 |
| | | | | 257/432 |
| 9,029,968 B2* | 5/2015 | Tsukagoshi | ............... | G01J 1/44 |
| | | | | 257/431 |
| 2012/0032340 A1 | 2/2012 | Choi et al. | | |
| 2015/0279778 A1 | 10/2015 | Camacho et al. | | |

FOREIGN PATENT DOCUMENTS

| | | |
|---|---|---|
| TW | 201145416 A1 | 12/2011 |
| TW | 201145456 A1 | 12/2011 |
| TW | 201232854 A1 | 8/2012 |

* cited by examiner

*Primary Examiner* — Calvin Lee
(74) *Attorney, Agent, or Firm* — Li & Cai Intellectual Property (USA) Office

(57) ABSTRACT

A light emitting chip package includes a light-emitting chip, a molding compound, and a redistribution wiring structure. The light-emitting chip includes an emission zone, a first electrode, and a second electrode. The molding compound covers at least a sidewall of the light-emitting chip and supports the light-emitting chip. The redistribution wring structure disposed in the molding compound includes a first interconnect wiring structure electrically connected to the first electrode and a second interconnect wiring structure electrically connected to the second electrode. The first interconnect wiring structure and the second interconnect wiring structure respectively include a first pad and a second pad, and the first pad and the second pad are located at the same side of the light emitting chip package.

8 Claims, 15 Drawing Sheets

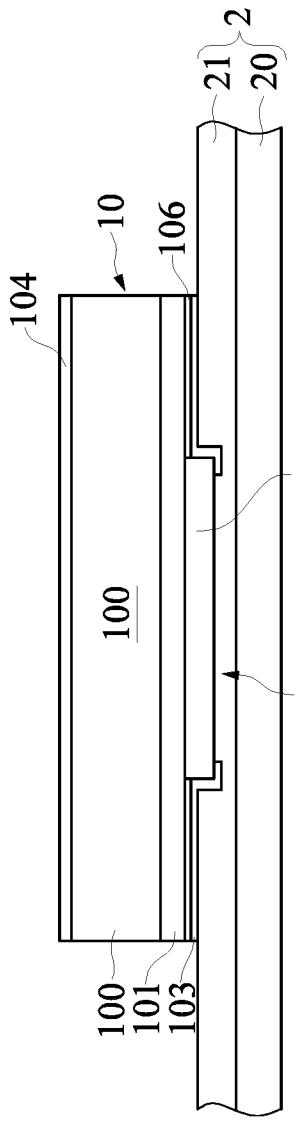
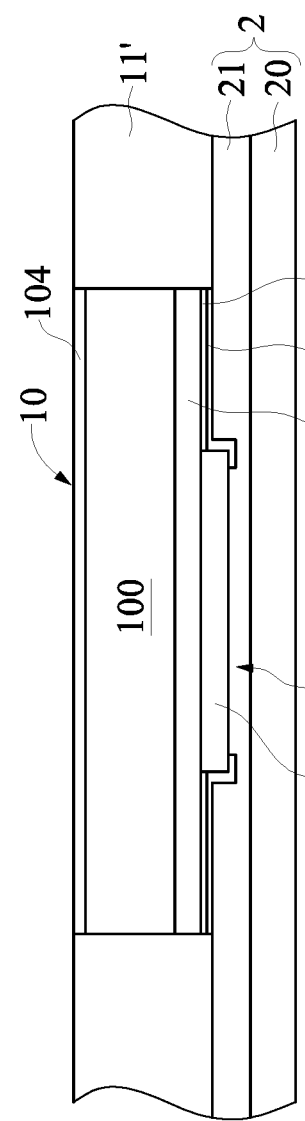
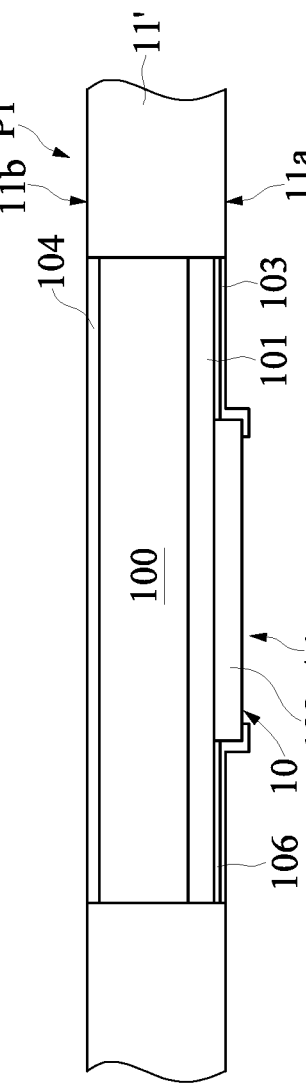
FIG. 2A
FIG. 2B
FIG. 2C

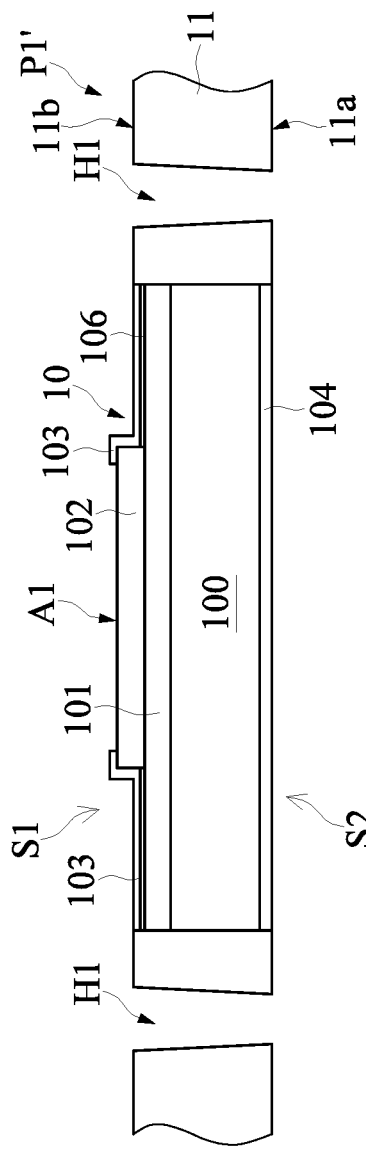
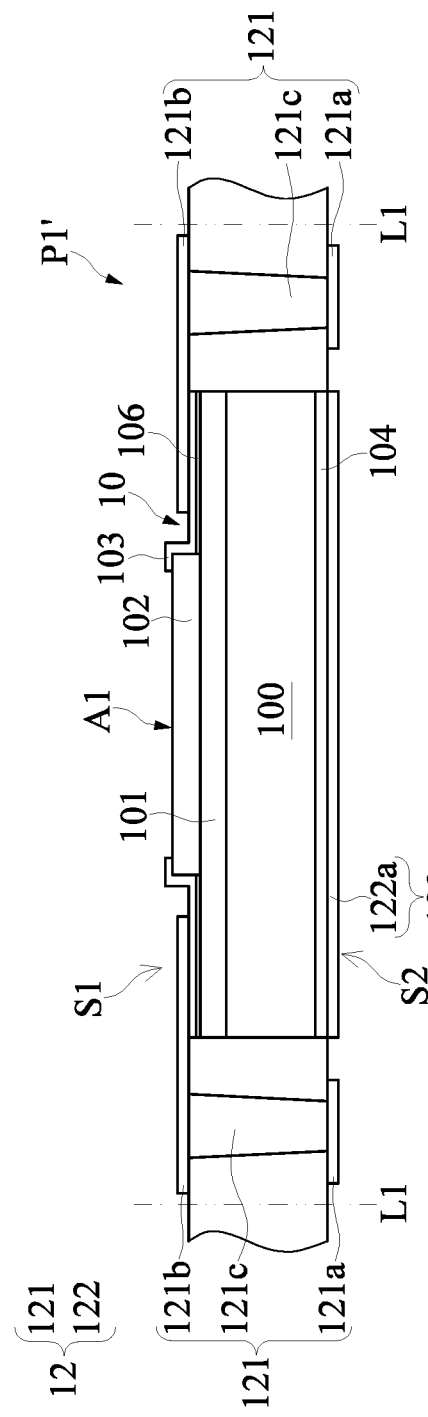

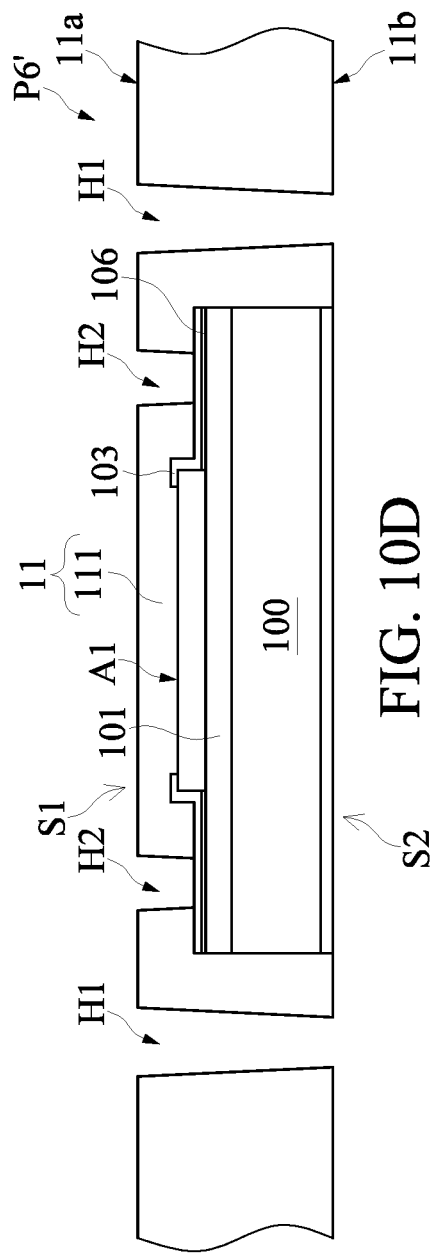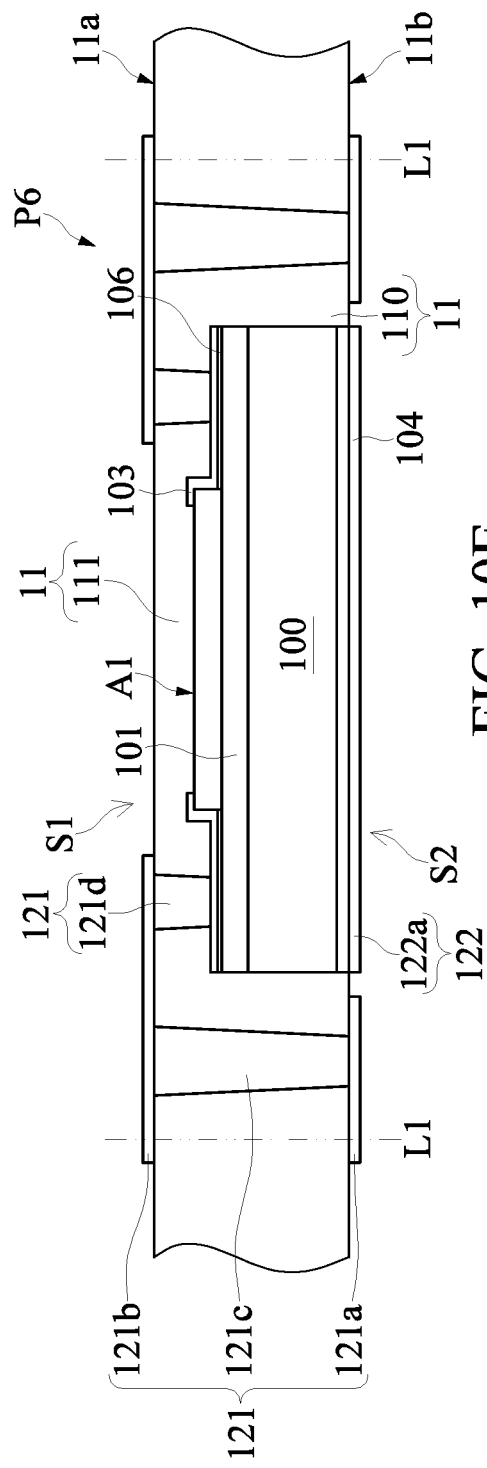

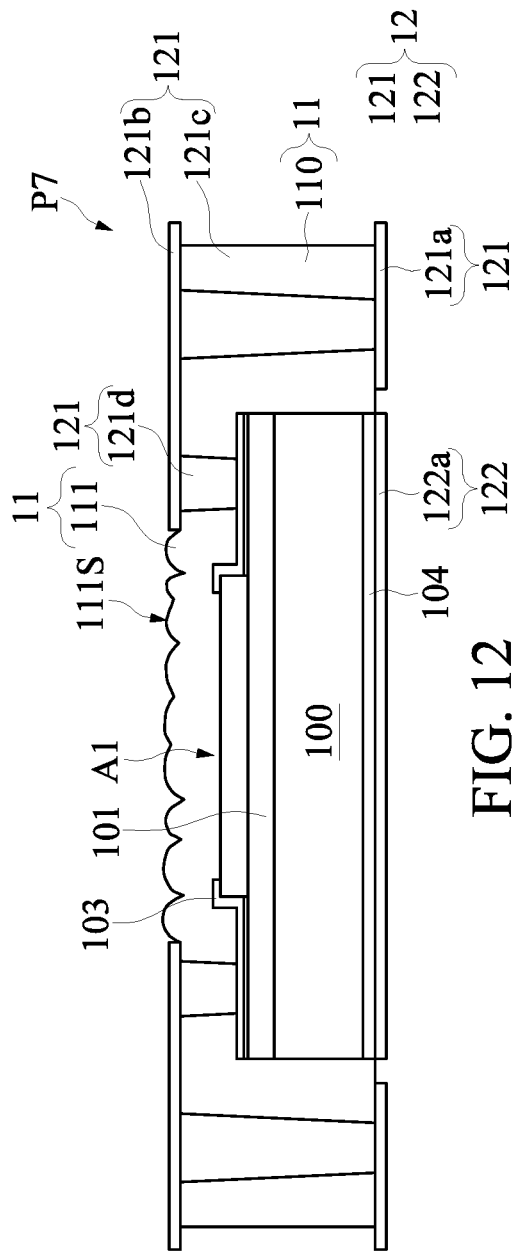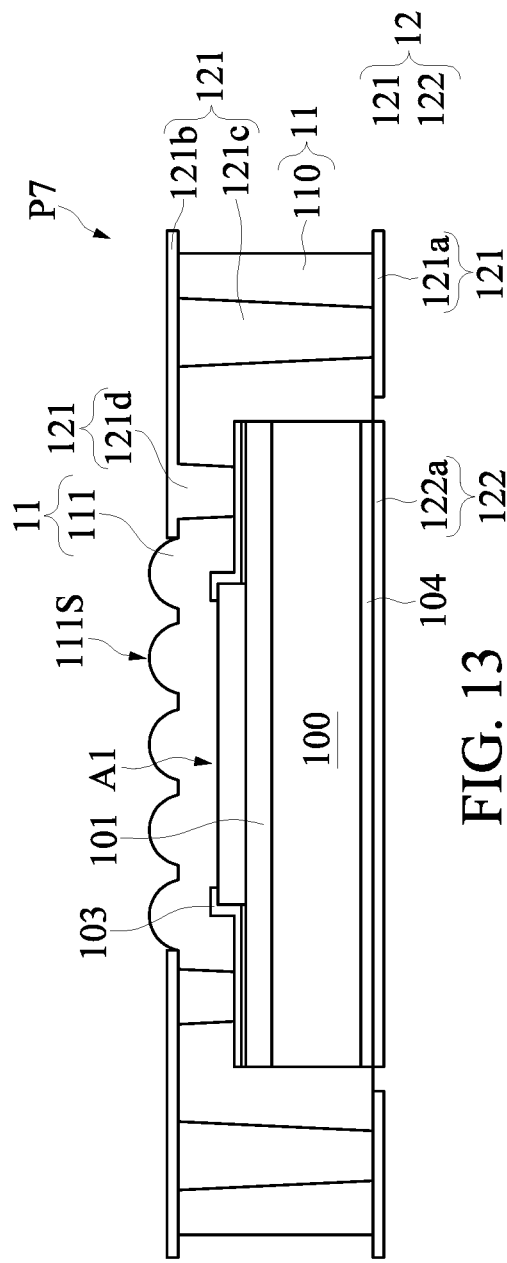

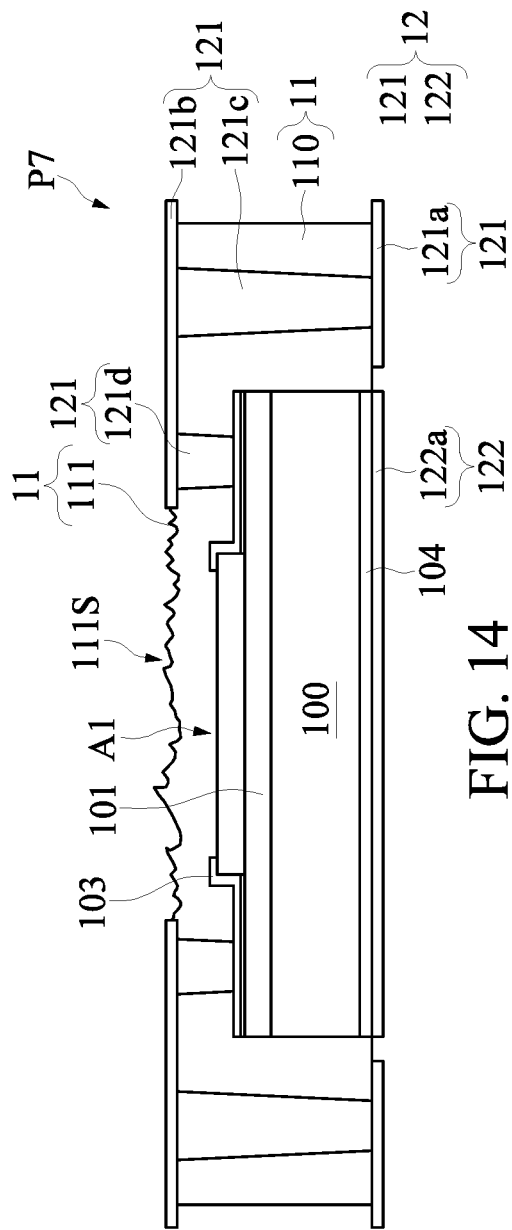
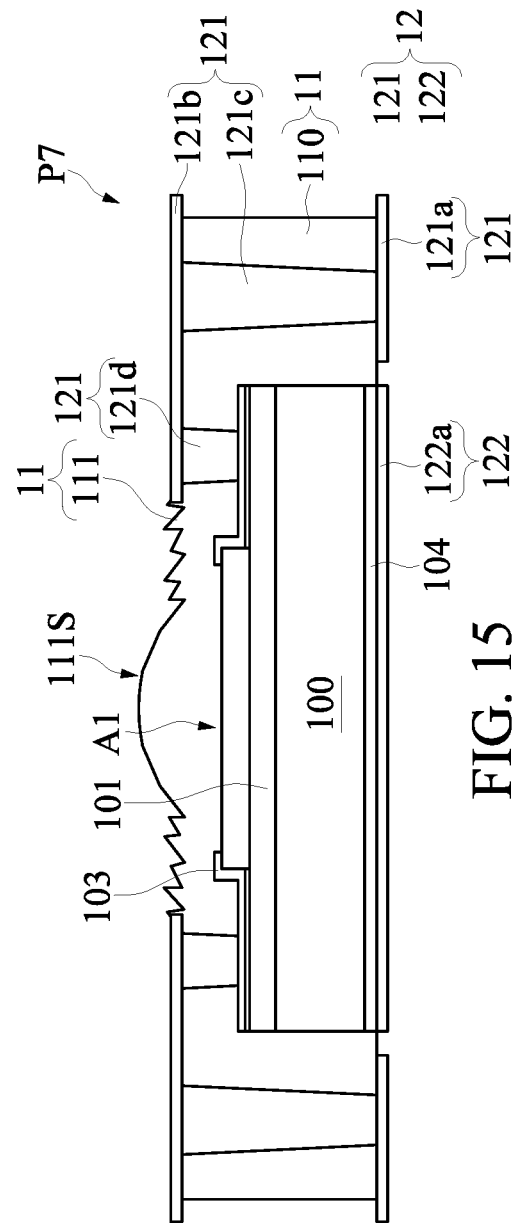

LIGHT-EMITTING CHIP PACKAGE

CROSS-REFERENCE TO RELATED PATENT APPLICATION

This application claims the benefit of priority to Taiwan Patent Application No. 107105773, filed on Feb. 21, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package, and more particularly to a light-emitting chip package.

BACKGROUND OF THE DISCLOSURE

The conventional light-emitting package structure usually includes a substrate, a semiconductor light-emitting die, a plurality of bonding wires, and a molding material. The semiconductor light-emitting die is electrically connected to the substrate by the bonding wires. The molding material covers the semiconductor light-emitting die, the bonding wires and a surface of the substrate to prevent moisture in the atmosphere from being absorbed by the semiconductor light-emitting die and the bonding wires.

However, it is difficult to minimize the overall size of the abovementioned light-emitting package structure due to the presence of the substrate and the bonding wires, thereby making it difficult to follow the trend toward miniaturization.

Currently, the package size may be further reduced by using the chip scale package (CSP) technique that is usually used to package other types of semiconductor dies. However, forming the flip-chip light-emitting package by CSP technique would incur higher costs.

SUMMARY OF THE DISCLOSURE

In response to the above-referenced technical inadequacies, the present disclosure provides a light-emitting chip package and a packaging method to solve the problems of higher cost and larger package volume in conventional package techniques.

In one aspect, the present disclosure provides a light-emitting chip package. The light-emitting chip package includes a light-emitting chip, a molding compound, and a redistribution wiring structure. The light-emitting chip includes an emission zone, a first electrode, and a second electrode. The molding compound at least covers a sidewall of the light-emitting chip and supports the light-emitting chip. The redistribution wiring structure is disposed in the molding compound. The redistribution wiring structure includes a first interconnect wiring structure electrically connected to the first electrode and a second interconnect wiring structure electrically connected to the second electrode. The first interconnect wiring structure and the second interconnect wiring structure respectively include a first pad and a second pad, and the first pad and the second pad are located at the same side of the light-emitting chip package.

Therefore, one of the advantages of the present disclosure is that in a light-emitting chip package and a packaging method of a light-emitting chip, by forming the redistribution wiring structure in the molding compound, a flip-chip light-emitting chip package without any substrate can be formed, thereby reducing the overall size thereof.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 2A is a schematic sectional view of a light-emitting chip package in one of the steps according to an embodiment of the present disclosure.

FIG. 2B is a schematic sectional view of the light-emitting chip package in one of the steps according to the embodiment of the present disclosure.

FIG. 2C is a schematic sectional view of the light-emitting chip package in one of the steps according to the embodiment of the present disclosure.

FIG. 2D is a schematic sectional view of the light-emitting chip package in one of the steps according to the embodiment of the present disclosure.

FIG. 2E is a schematic sectional view of the light-emitting chip package in one of the steps according to the embodiment of the present disclosure.

FIG. 10D is a schematic sectional view of the light-emitting chip package in one of the steps according to the embodiment of the present disclosure.

FIG. 10E is a schematic sectional view of the light-emitting chip package in one of the steps according to the embodiment of the present disclosure.

FIG. 12 is a schematic sectional view of a light-emitting chip package according to another embodiment of the present disclosure.

FIG. 13 is a schematic sectional view of a light-emitting chip package according to another embodiment of the present disclosure.

FIG. 14 is a schematic sectional view of a light-emitting chip package according to another embodiment of the present disclosure.

FIG. 15 is a schematic sectional view of a light-emitting chip package according to another embodiment of the present disclosure.

DETAILED DESCRIPTION OF THE EXEMPLARY EMBODIMENTS

Figure 1:
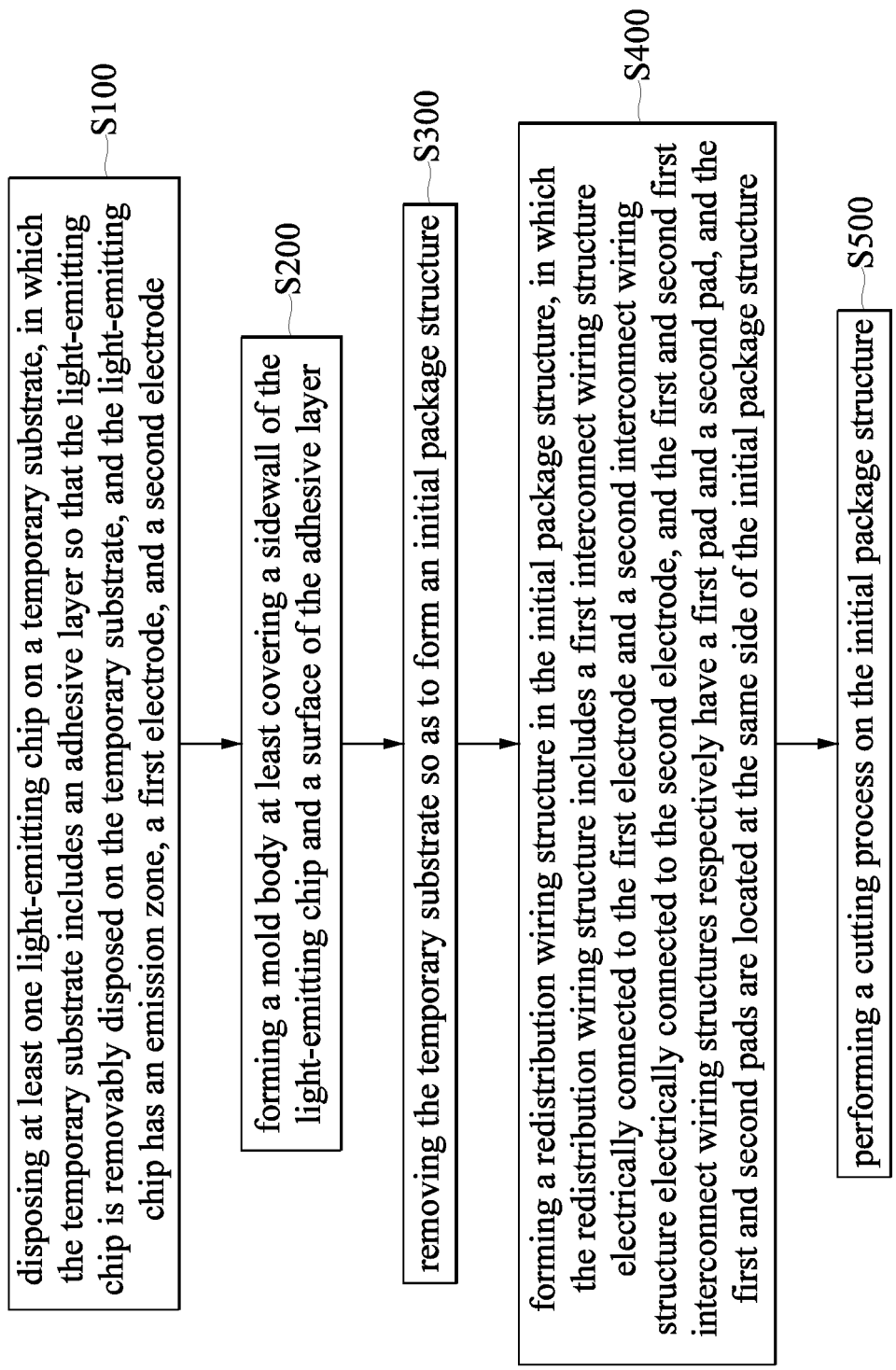
FIG. 1 is a flowchart of a packaging method of a light-emitting chip package according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a package and packaging method of a light-emitting chip. The packaging method is adapted to package the light-emitting chip having a lateral structure or a vertical structure. The light-emitting chip can be, but not limited to, an LED chip, an OLED chip, or a laser diode (LD) chip, and so on. The LD chip can be a vertical cavity surface emitting laser or an edge emitting laser. Reference is made to FIG. 1, which shows a flowchart of a packaging method of a light-emitting chip according to an embodiment of the present disclosure.

As shown in FIG. 1, in step S100, a light-emitting chip is disposed on a temporary substrate, in which the temporary substrate includes an adhesive layer so that the light-emitting chip is removably disposed on the temporary substrate. In step S200, a mold body is formed to cover at least a sidewall of the light-emitting chip and a surface of the adhesive layer. In step S300, the temporary substrate is removed so as to form an initial package structure. In step S400, a redistribution wiring structure is formed in the initial package structure. In step S500, a cutting process is performed on the initial package structure so as to form a light-emitting chip package.

Reference is made to FIG. 2A to FIG. 2E, which respectively show the sectional views of a light-emitting chip package in different steps according to an embodiment of the present disclosure. As shown in FIG. 2A, at least one light-emitting chip 10 is disposed on a temporary substrate 2. The light-emitting chip 10 having a lateral structure or a vertical structure can be an LED chip, an OLED chip, a VCSEL, or an EEL, and so on. In the instant embodiment, the LD chip having a vertical structure is taken as an example for description, in which the LD chip having a vertical structure is a VCSEL.

The light-emitting chip 10 of the present embodiment includes a substrate 100, a first reflector 101, an active layer (not shown), a second reflector 102, a first electrode 103, and a second electrode 104. The first reflector 101, the active layer and the second reflector 102 are disposed on the substrate 100, and the active layer is interposed between the first and second reflectors 101, 102.

Each of the first and second reflectors 101, 102 can be a distributed Bragg reflector (DBR) that is formed by alternately stacking layers having different refractive indices on top of one another, so as to allow light having a predetermined wavelength to emit out of the second reflector 102. In one embodiment, the first reflector 101 is an n-type DBR, and the second reflector 102 is a p-type DBR.

The active layer is interposed between the first reflector 101 and the second reflector 102, and excited by electric power so as to produce an initial laser beam. It should be noted that the second reflector 102 shown in FIG. 2A is indented relative to the first reflector 101 so as to form a mesa portion, but the present disclosure is not limited to the example provided herein. In another embodiment, the second reflector 102 completely covers the surface of the first reflector 101.

In the present embodiment, the first electrode 103 and the second electrode 104 can be a single metal layer, an alloy layer or a stacked layer made of different metals. The first electrode 103 is disposed on the second reflector 102, and the second electrode 104 is disposed on the bottom surface of the substrate 100.

Specifically, the first electrode 103 is in electrical contact with the second reflector 102, and the second electrode 104 is in electrical contact with the substrate 100 or the first reflector 101. When a bias is applied to the first electrode 103 and the second electrode 104, a current path passing through the active layer can be generated between the first electrode 103 and the second electrode 104. Furthermore, the first electrode 103 has an aperture for defining an emission zone A1, and the first electrode 103 is insulated from the first reflector 101 by an insulating protective layer 106.

Accordingly, the first electrode 103 and the emission zone A1 are located at the same side of the light-emitting chip 10 of the present embodiment, and the second electrode 104 is located at another side opposite to the side where the emission zone A1 is located. That is to say, the first electrode 103 and the second electrode 104 are respectively located at two opposite sides of the light-emitting chip 10. However, in another embodiment, the first electrode 103, the second electrode 104, and the emission zone A1 can be located at the same side of the substrate 100.

Furthermore, in the present embodiment, the temporary substrate 2 includes a supporting board 20 and an adhesive layer 21 disposed on the supporting board 20. When the light-emitting chip 10 is disposed on the temporary substrate 2, the light-emitting chip 10 is flipped over and disposed on the temporary substrate 2 with the emission zone A1 facing toward the adhesive layer 21.

In the present embodiment, the supporting board 20 can be a metal board, a ceramic board, a composite board or other boards capable of supporting the light-emitting chip 10, and the present disclosure is not limited thereto. The adhesive layer 21 is made of a soft material and has a predetermined thickness. As such, the adhesive layer 21 can deform according to a surface contour of the light-emitting chip 10 so as to prevent the emission zone A1 of the light-emitting chip 10 from damage. In other words, when the light-emitting chip 10 is disposed on the temporary substrate 2, a portion of the light-emitting chip 10 is embedded in the adhesive layer 21.

Furthermore, a binding force between the adhesive layer 21 and the supporting board 20 is greater than that between the adhesive layer 21 and the light-emitting chip 10 to prevent the light-emitting chip 10 from damage when the temporary substrate 2 is separated from the light-emitting chip 10. In one embodiment, the adhesive layer 21 is a release layer or a peelable layer.

It should be noted that FIG. 2A shows only one light-emitting chip 10 disposed on the temporary board 2, but the temporary board 2 can be disposed with more than one light-emitting chip 10 at the same time so that more than one light-emitting chip 10 can be packaged simultaneously during the actual fabrication process.

As shown in FIG. 2B, a mold body 11' is formed to cover at least a sidewall of the light-emitting chip 10 and a surface of the adhesive layer 21. The mold body 11' is made of epoxy, epoxy molding compound (EMC), silicone or other materials suitable for packaging, and the present disclosure is not limited thereto. As shown in FIG. 2B, the mold body 11' has a first surface 11a and a second surface 11b opposite to the first surface 11a, the first surface 11a being in contact with the adhesive layer 21. In the present embodiment, the mold body 11' does not cover the second electrode 104 such that the second electrode is exposed from the mold body 11'. That is to say, the second surface 11b of the mold body 11' in the present embodiment is coplanar with a bottom surface, i.e., the bottom surface of the second electrode 104, of the light-emitting chip 10.

Specifically, the mold body 11' can be formed by performing an injection molding process. First, a molding material is injected into a mold, and then an initial mold body is formed after the molding material is cured. However, the initial mold body not only covers the sidewall of the light-emitting chip 10 but also covers the second electrode 104 of the light-emitting chip 10. Accordingly, during the formation of the mold body 11', the initial mold body can be further thinned from the back side thereof so that the second electrode 104 can be exposed from the mold body 11', which is beneficial for the convenience in fabricating the wiring layer in the following processes.

In another embodiment, the aforementioned thinning process can be omitted, and the following processes of forming a redistribution wiring structure electrically connected to the second electrode 104 can be directly performed.

As shown in FIG. 2C, the temporary substrate 2 is removed so as to form an initial package structure P1'. The initial package structure P1' includes the light-emitting chip 10 and the mold body 11' covering the sidewall of the light-emitting chip 10. Accordingly, the initial package structure P1' has a light emergent side S1 and a bottom side S2 opposite thereto. The first electrode 103 is located at the light emergent side S1 where the emission zone A1 is located, and the second electrode 104 is located at the bottom side S2.

Since the light-emitting chip 10 is disposed on the temporary substrate 2 with the emission zone A1 facing toward the temporary substrate 2 during the previous steps, the emission zone A1 of the initial package structure P1' is exposed from, instead of being covered by, the mold body 11'.

As shown in FIG. 2D and FIG. 2E, a redistribution wiring structure 12 is formed in the initial package structure P1'. It should be noted that compared to the conventional chip package structure, the mold body 11' in the embodiments of the present disclosure is used to serve as a base for fabrication of the redistribution wiring structure 12 so as to form a flip-chip light-emitting chip package. The details of forming the redistribution wiring structure 12 according to one embodiment of present disclosure will be further described in the following descriptions.

As shown in FIG. 2D, at least one through hole H1 (two through holes H1 are shown in FIG. 2D) is formed in the mold body 11'. That is to say, the through hold H1 extends from the first surface 11a to the second surface 11b of the mold body 11'.

As shown in FIG. 2E, the redistribution wiring structure 12 is fabricated. In the present embodiment, the redistribution wiring structure 12 includes a first interconnect wiring structure 121 electrically connected to the first electrode 103 and a second interconnect wiring structure 122 electrically connected to the second electrode 104. The first interconnect wiring structure 121 and the second interconnect wiring structure 122 respectively have a first pad 121a and a second pad 122a, and the first and second pads 121a, 122a are located at the same side, i.e., the bottom side S2 of the initial package structure P1'.

The first interconnect wiring structure 122 further includes a first conductive layer 121b and a first conductive post 121c, and the first conductive layer 121b is electrically connected to the first pad 121a located at the bottom side S2 through the first conductive post 121c. Furthermore, in the present embodiment, the second pad 122a of the second interconnect wiring structure 122 directly covers the second electrode 104.

Accordingly, the processes of forming the redistribution wiring structure 12 further includes a step of forming a conductive material in the through hole H1 to form the first conductive post 121c. In one embodiment, the first conductive post 121c can be formed in the through hole H1 by electroplating or electroless plating.

The first conductive layer 121b is formed at the light emergent side S1 to be electrically connected between the first electrode 103 and the first conductive post 121c. The first pad 121a electrically connected to the first conductive post 121c and the second pad 122a electrically connected to the second electrode 104 are formed at the bottom side S2. In one embodiment, each side is formed with one conductive layer by electroplating or electroless plating. Thereafter, two conductive layers are individually etched so as to form the first conductive layer 121b at the light emergent side S1 and form the first and second pads 121a, 122a at the bottom side S2, respectively. The order of forming the first conductive layer 121b at the light emergent side S1 and forming the first and second pads 121a, 122a at the bottom side S2 is not limited in the present disclosure.

As shown in FIG. 2E, after the formation of the redistribution wiring structure 12, a cutting process is performed on the initial package structure P1' along a plurality of cutting lines which are defined in advance so as to form a plurality of separated light-emitting chip packages P1. By performing the manufacturing method of the light-emitting chip package P1, the substrate-free and flip-chip light-emitting chip packages P1 can be fabricated.

Furthermore, compared to the conventional chip scale package (CSP) technique, the fabrications of the interconnect wiring structures of the flip-chip do not have to be performed at wafer level, thereby significantly reducing the fabrication cost.

Figure 3A:
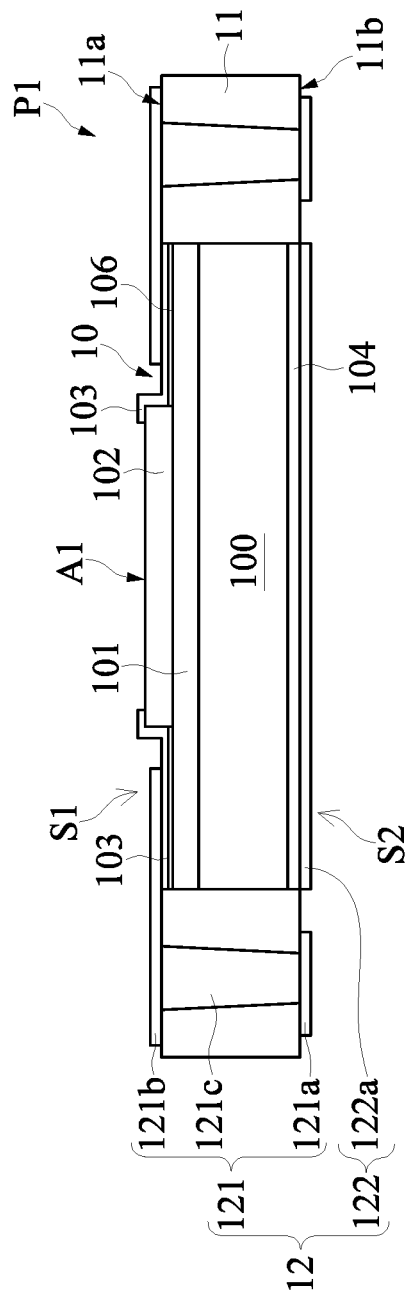
FIG. 3A is a schematic sectional view of the light-emitting chip package according to an embodiment of the present disclosure.
Figure 3B:
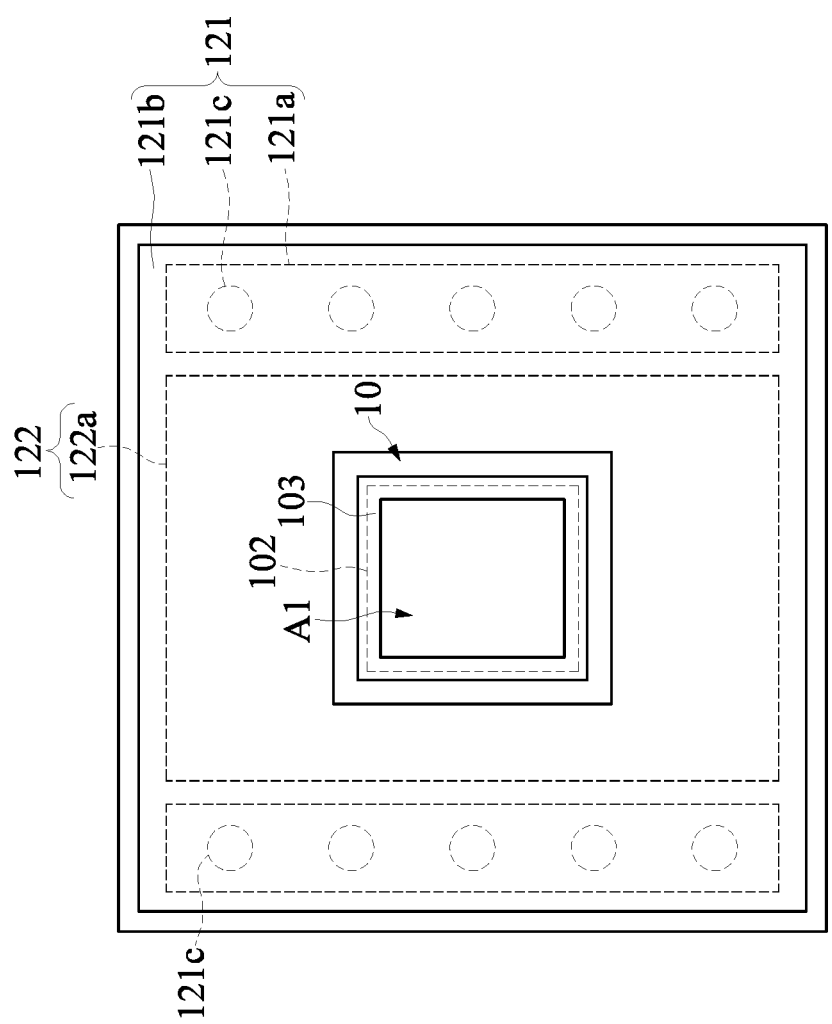
FIG. 3B is a schematic top view of the light-emitting chip package shown in FIG. 3A.

Reference is made to FIG. 3A and FIG. 3B, which respectively show schematic sectional and top views of the light-emitting chip package in one of the steps according to an embodiment of the present disclosure.

The light emitting package P1 of the embodiment in the present disclosure includes a light-emitting chip 10, a molding compound 11, and a redistribution wiring structure 12. Furthermore, the light emitting package P1 has a light emergent side S1 and a bottom side S2 opposite thereto. The light emergent side S1 described in the following description means a side where the emission zone A1 of the light-emitting chip 10 is located.

As mentioned above, the light-emitting chip 10 has the emission zone A1, the first electrode 103, and the second electrode 104. In the present embodiment, the first and second electrodes 103, 104 are respectively located at two opposite sides of the light-emitting chip 10.

Furthermore, the molding compound 11 covers a sidewall of the light-emitting chip 10, but does not cover the top and bottom surfaces of the light-emitting chip 10. That is, the emission zone A1 of the light-emitting chip 10 is exposed from the molding compound 11. In the present embodiment, the second surface 11b of the molding compound 11 is coplanar with the surface of the second electrode 104.

As shown in FIG. 3A, the redistribution wiring structure 12 is disposed in the molding compound 11 and includes the first interconnect wiring structure 121 electrically connected to the first electrode 103 and the second interconnect wiring structure 122 electrically connected to the second electrode 122.

In the present embodiment, the first interconnect wiring structure 121 includes the first conductive layer 121b, the first conductive post 121c passing through the molding compound 11, and the first pad 121a, which are electrically connected to one another. Accordingly, the first electrode 103 located at the light emergent side S1 can be electrically connected to the first pad 121a through the first conductive layer 121b and the first conductive post 121c.

Reference is made to FIG. 3B. The first conductive layer 121b of the present embodiment has an opening to expose the emission zone A1. Furthermore, the number of the first conductive post 121c can be adjusted according to particular implementations, and the present disclosure is not limited to the examples provided herein. For example, the first interconnect wiring structure 121 can include more first conductive posts 121c for a high-power light-emitting chip 10. For a low-power light-emitting chip 10, the first interconnect wiring structure 121 can also include only one first conductive post 121c.

That is to say, the packaging method provided in the embodiment of the present disclosure is not only adapted for packaging of the low-power light-emitting chip 10, but also for packaging of the high-power light-emitting chip 10 by adjusting the number of the conductive posts in the molding compound 11.

Reference is made to FIG. 3A. The second interconnect wiring structure 122 includes the second pad 122a located at the bottom side S2, the second pad 122a covering the second electrode 104. The first and second pads 121a, 122a of the light-emitting chip package P1 in the present embodiment are located at the same side, i.e., the bottom side S2 of the light-emitting chip package P1, for being electrically connected to an external circuit. Accordingly, the light-emitting chip package P1 in the present embodiment of the present disclosure can be mounted on a circuit board by using surface-mount technology (SMT).

In the present embodiment, the molding compound 11 does not cover the second electrode 104, but in another embodiment, the molding compound 11 can partially cover the surface of the second electrode 104. Under this circumstance, the second pad 122a can be formed on the second surface 11b of the molding compound 11 and electrically connected to the second electrode 104 through another conductive post.

Figure 4:
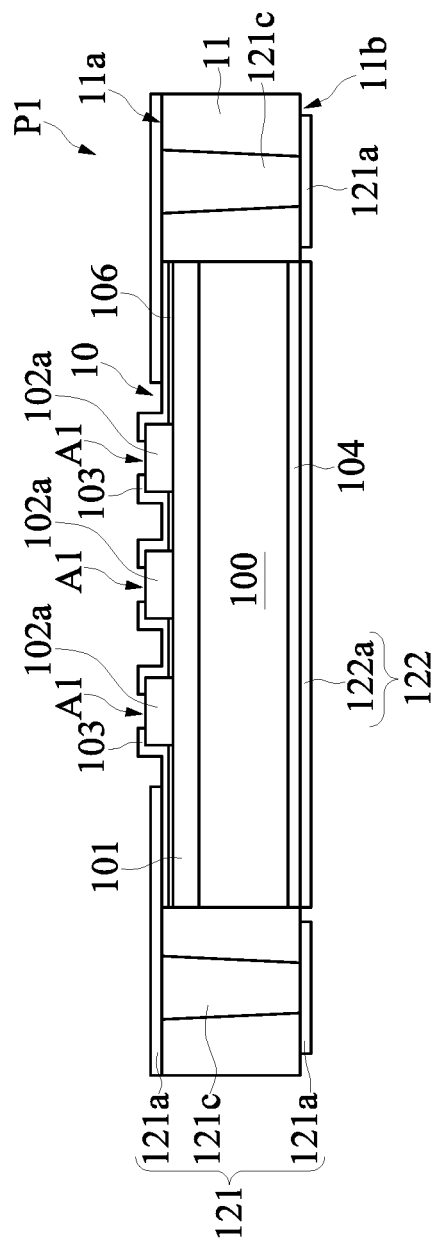
FIG. 4 is a schematic sectional view of a light-emitting chip package according to another embodiment of the present disclosure.

Furthermore, the method provided in FIG. 1 can be adapted for packing of the light-emitting chips 10 respectively having different structures so as to form different flip-chip light-emitting chip packages P1. Reference is next made to FIG. 4. In the light-emitting chip package P1 shown in FIG. 4, the second reflector of the light-emitting chip 10 has a plurality of separate sub-structures 102a, such that the light-emitting chip 10 has a plurality of emission zones A1 which are spaced apart from one another.

Figure 5:
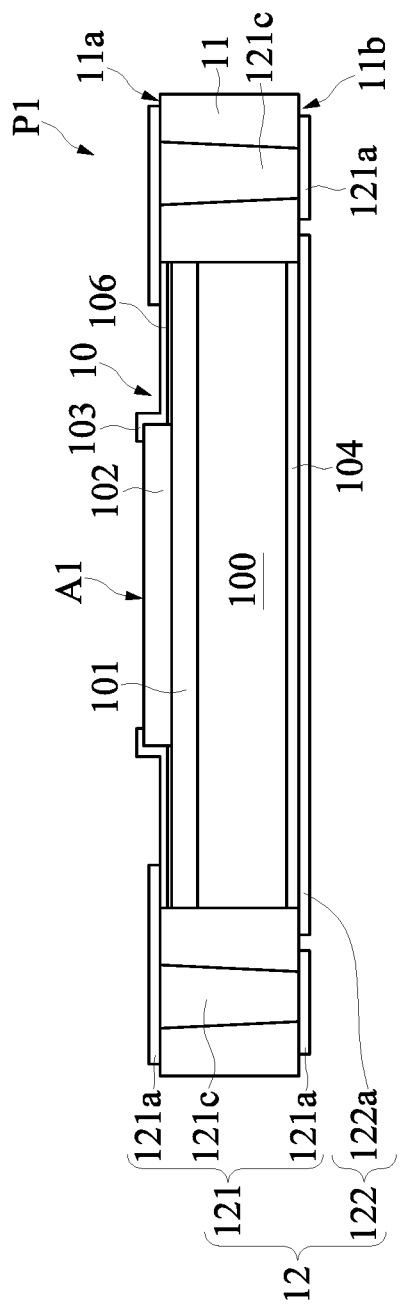
FIG. 5 is a schematic sectional view of a light-emitting chip package according to yet another embodiment of the present disclosure.

Reference is made to FIG. 5. In the light-emitting chip package P1 shown in FIG. 5, the area of the second pad 122a is greater than or equal to that of the second electrode 104 so that the heat generated by the light-emitting chip 10 can be dissipated more efficiently.

Figure 6:
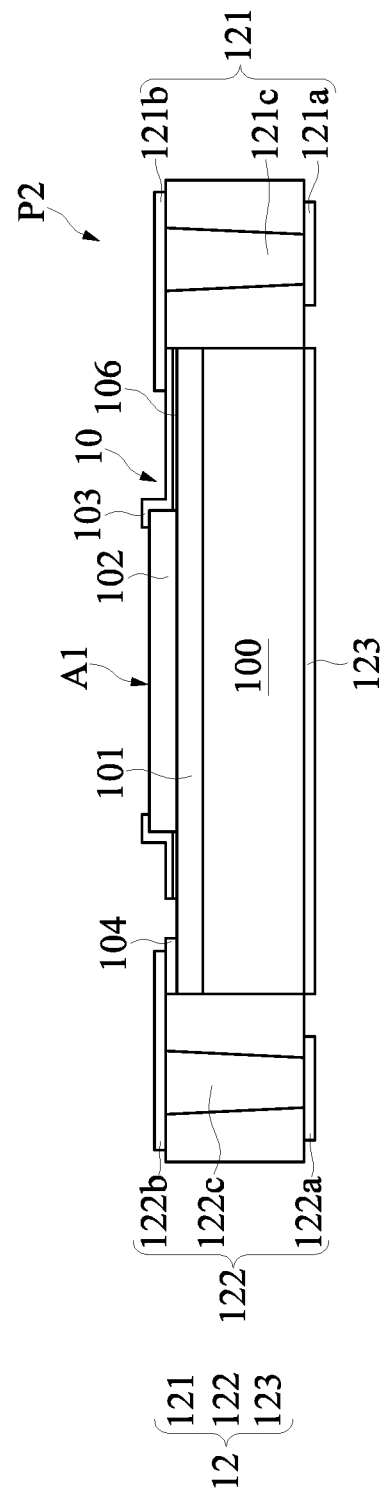
FIG. 6 is a schematic sectional view of a light-emitting chip package according to another embodiment of the present disclosure.

Reference is made to FIG. 6. In the light-emitting chip package P2 shown in FIG. 6, the first electrode 103 and the second electrode 104 of the light-emitting chip 10 are located at the same side, i.e., at the light emergent side S1 of the light-emitting chip packages P2.

The second interconnect wiring structure 122 can further include a second conductive layer 122b located at the light emergent side S1 and a second conductive post 122c passing through the molding compound 11. The second conductive layer 122b, the second conductive post 122c and the second pad 122a are electrically connected to one another, and the second electrode 104 is electrically connected to the second pad 122a at the bottom side S2 through the second conductive layer 122b and the second conductive post 122c. That is to say, regardless of the arrangements of the first electrode 103 and the second electrode 104 of the light-emitting chip 10, the flip-chip light-emitting chip package P1 (P2) can be formed by modifying the redistribution wiring structure 12 in the molding compound 11.

Furthermore, in the present embodiment, the second pad 122a is not in contact with the bottom of the light-emitting chip 10. Accordingly, the redistribution wiring structure 12 can further include a conductive heat dissipation layer 123 so as to dissipate the heat generated by the light-emitting chip 10. In the present embodiment, the conductive heat dissipation layer 123 is spaced apart from the first pad 121a. Furthermore, the conductive heat dissipation layer 123, the first pad 121a, and the second pad 122a can be formed during the same process.

It should be noted that the light-emitting chip 10 can be packaged with another element by the packaging method provided in the embodiment of the present disclosure, and the size of the element does not have to be the same as that of the light-emitting chip 10.

Figure 7:
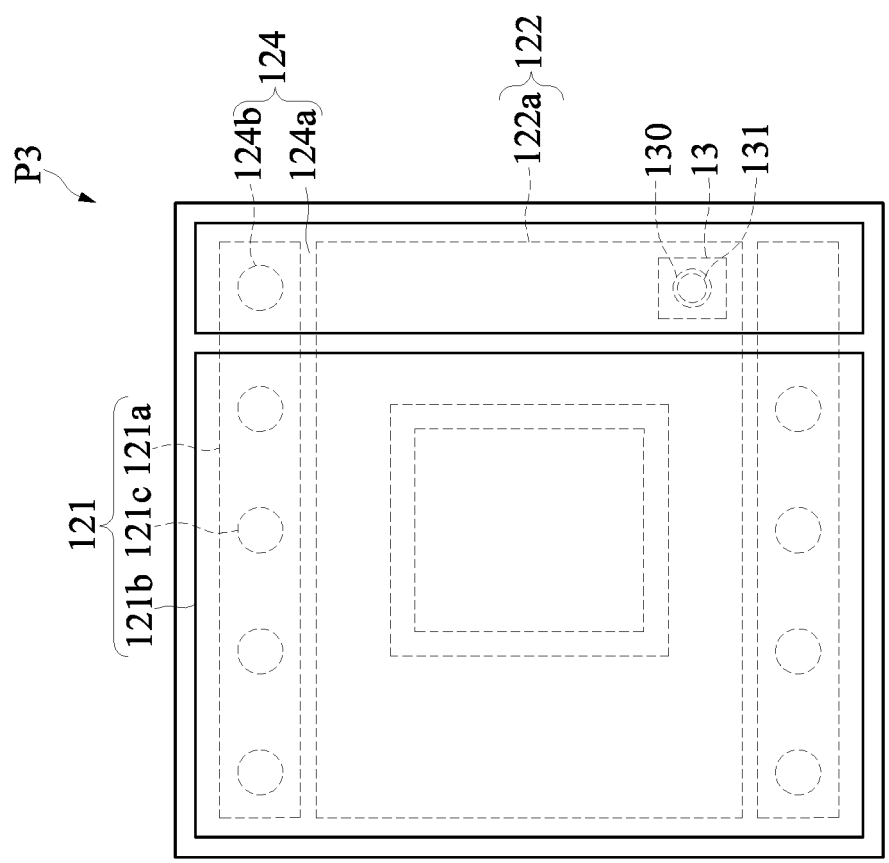
FIG. 7 is a schematic top view of a light-emitting chip package according to another embodiment of the present disclosure.

Reference is made to FIG. 7. In the present embodiment, the light-emitting chip 10 is packaged with a passive element 13, and the light-emitting chip 10 is electrically connected to the passive element 13 through the redistribution wiring structure 12.

Specifically, the light-emitting chip package P3 further includes a passive element 13 which is embedded in the molding compound 11. The redistribution wiring structure 12 further includes a third interconnect wiring structure 124 so that the passive element 13 is electrically connected to the light-emitting chip 10.

The passive element 13 can be, for example, a Zener diode, a capacitor, or an inductor, and the present disclosure is not limited thereto. In the present embodiment, the Zener diode is taken as an example, and the Zener diode is electrically connected to the light-emitting chip 10 so as to serve as an electrostatic discharge protective device. In the present embodiment, the passive element 13 has an anode 130 and a cathode 131, which are respectively located at two opposite sides thereof and electrically connected to the light-emitting chip 10 through the redistribution wiring structure 12 to protect the light-emitting chip 10 from electrostatic discharge damage.

As shown in FIG. 7, the third interconnect wiring structure 124 includes a third conductive layer 124a located at the light emergent side S1 and a third conductive post 124b passing through the molding compound 11. The third conductive layer 124a is electrically connected to the anode 130 of the passive element 13, and the third conductive layer 124a is separated from the first conductive layer 121b. The third conductive layer 124a can be directly in contact with the anode 130 of the passive element 13 or indirectly connected to the anode 130 through another conductive post formed in the molding compound 11.

The third conductive layer 124a can be electrically connected to the first pad 121a located at the bottom side through the third conductive post 124b. Furthermore, the cathode 131 of the passive element 13 is electrically connected to the second pad 122a located at the bottom side. Accordingly, an electrical connection between the light-emitting chip 10 and the passive element 13 can be established.

It should be noted that the electrical connected between the light-emitting chip 10 and the passive element 13 shown in FIG. 7 is only intended to be exemplary. In another embodiment, the structures and positions of the third conductive layer 124a and the third conductive post 124b can be modified according to the requirements of circuit design so as to form another third interconnect wiring structure 124 with different structure.

Additionally, more of the light-emitting chips 10 can be packaged in the same package by using the packaging method of the embodiment of the present disclosure.

Figure 8:
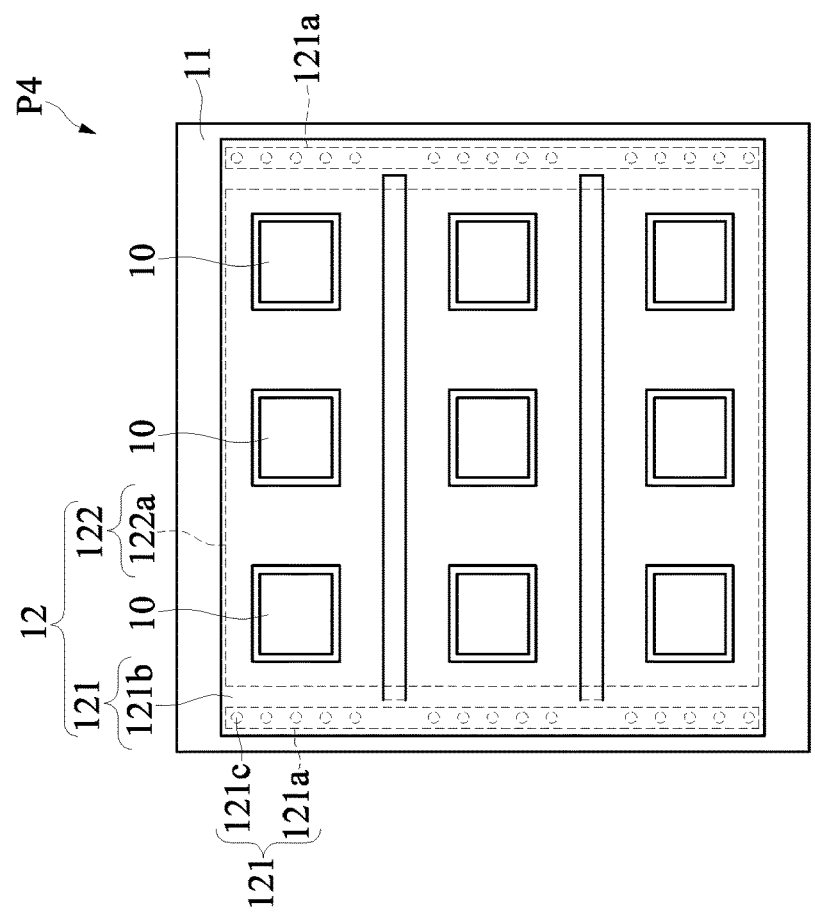
FIG. 8 is a schematic top view of a light-emitting chip package according to another embodiment of the present disclosure.

As shown in FIG. 8, the light-emitting chip package P4 includes a plurality of light-emitting chips 10. That is to say, the molding compound 11 covers each sidewall of each of the light-emitting chips 10. Furthermore, the light-emitting chips 10 can be electrically connected to one another through the redistribution wiring structure 12 of the present embodiment. For example, the first electrodes 103 of the light-emitting chips 10 can be jointly connected to the first conductive layer 121b, the first conductive layer 121b being electrically connected to the first pad 121a at the bottom side through a plurality of first conductive posts 121c.

Moreover, the second electrodes 104 of the light-emitting chips 10 can be jointly connected to the second pad 122a at the bottom side. Specifically, in the present embodiment, the second pad 122a covers all of the bottom surfaces of the light-emitting chips 10 so as to be in electrical contact with the second electrodes 104 of the light-emitting chips 10. Accordingly, the first and second pads 121a, 122a are both located at the bottom side of the light-emitting chip package P4.

In the manufacturing method of the light-emitting chip package P4 of the present embodiment, the light-emitting chips 10 can be divided into a plurality of sub-groups before the light-emitting chips 10 are disposed on the temporary substrate 2. Each of sub-groups includes a predetermined number of the light-emitting chips 10. After the mold body is formed, the redistribution wiring structure 12 is formed so that the light-emitting chips 10 of each sub-group can be electrically connected to one another. Thereafter, a cutting process is performed to form a plurality of light-emitting chip packages P4. The light-emitting chips 10 in the same sub-group are packaged in the same light-emitting chip package P4.

The light-emitting chip package P4 can serve as an area light source and be used in the illumination device. Accordingly, it is not necessary for the light-emitting chip package P4 to be disposed on another circuit board. That is, the light-emitting chip package P4 can receive the electric power from an external power source directly through power lines. Under this condition, the first and second pads 121a, 122a can be disposed at the light emergent side of the light-emitting chip package P4.

Figure 9:
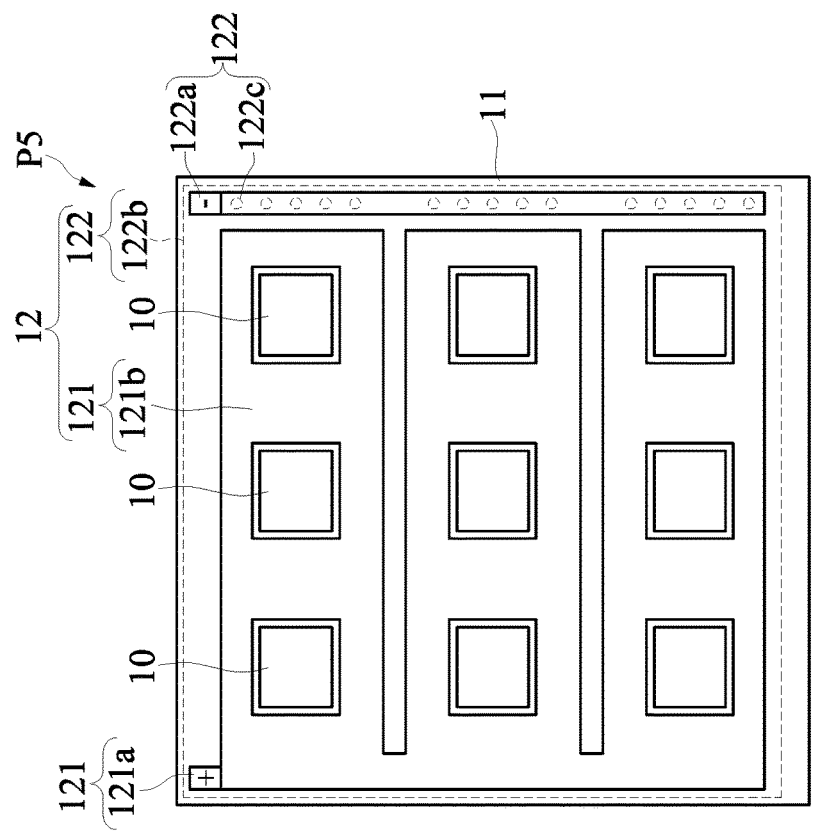
FIG. 9 is a schematic top view of a light-emitting chip package according to another embodiment of the present disclosure.

Reference is made to FIG. 9. The first and second pads 121a, 122a of the light-emitting chip package P5 are both located at the light emergent side.

Specifically, in the present embodiment, the light-emitting chips 10 can be electrically connected to one another through the redistribution wiring structure 12. However, the first interconnect wiring structure 121 only has the first conductive layer 121b and the first pad 121a, which are located at the light emergent side. All of the first electrodes 103 of the light-emitting chips 10 can be electrically connected to the same first pad 121a through the continuous first conductive layer 121b.

The second interconnect wiring structure 122 includes the second conductive layer 122b, the second conductive post 122c, and the second pad 122a. In the present embodiment, the second conductive layer 122b is located at the bottom side of the light-emitting chip package P5 so as to be in electrical contact with the second electrodes 104 of the light-emitting chips 10. Furthermore, the second pad 122a is located at the light emergent side. Accordingly, the second electrode 104 of each light-emitting chip 10 can be electrically connected to the second pad 122a at the light emergent side through the second conductive layer 122b at the bottom side and the second conductive post 122c passing through the molding compound 11.

The number of the light-emitting chips 10 packaged in the light-emitting chip package P4 or P5 can be adjusted according to particular implementations, and the present disclosure is not limited to the examples provided herein.

Reference is made to FIG. 10A to FIG. 10E, which show the details of the packaging method of the light-emitting chip according to another embodiment of the present disclosure.

Figure 10A:
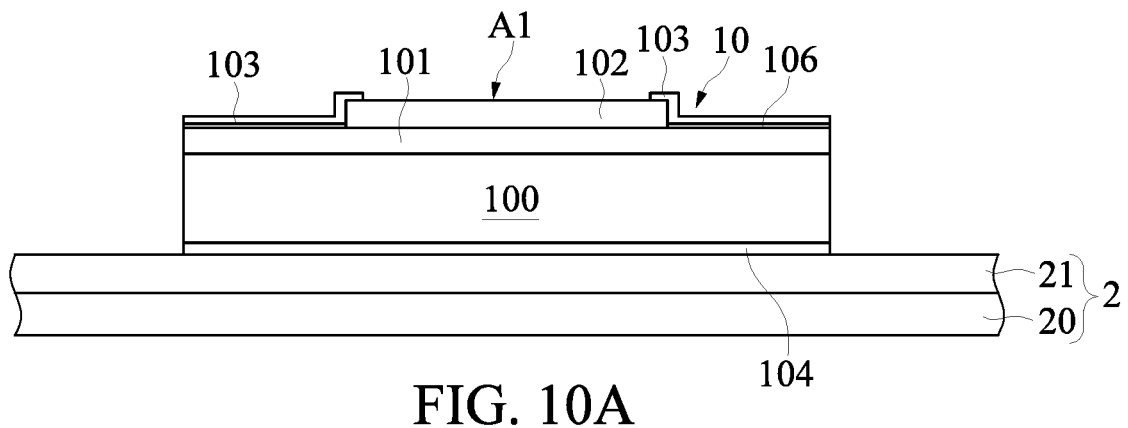
FIG. 10A is a schematic sectional view of a light-emitting chip package in one of the steps according to an embodiment of the present disclosure.

As shown in FIG. 10A, in the present embodiment, the light-emitting chip 10 is disposed on the temporary substrate 2 with the emission zone A1 of the light-emitting chip 10 facing toward a direction opposite to the adhesive layer 21. That is to say, the light-emitting chip 10 is adhered to the adhesive layer 21 through the bottom surface thereof.

Figure 10B:
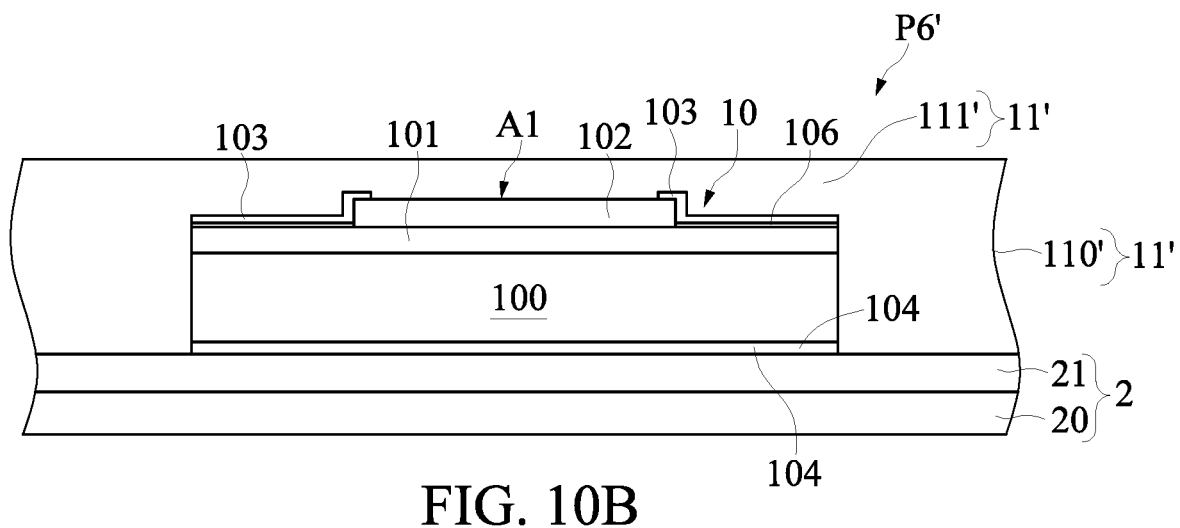
FIG. 10B is a schematic sectional view of the light-emitting chip package in one of the steps according to the embodiment of the present disclosure.

As shown in FIG. 10B, the mold body 11' is formed to cover the light-emitting chip 10. In the present embodiment, the mold body 11' covers the whole light-emitting chip 10. Specifically, the mold body 11' includes a surrounding portion 110' and a covering portion 111' connected to the surrounding portion 110'. The surrounding portion 110' covers the sidewall of the light-emitting chip 10, and the covering portion 111' covers the entire emission zone A1.

The mold body 11' has a first surface 11a and a second surface 11b opposite to the first surface 11a, and the mold body 11' is in contact with the adhesive layer 21 with the first surface 11a. Accordingly, a height of the first surface 11a of the mold body 11' relative to the surface of the adhesive layer 21 is higher than that of the top surface of the light-emitting chip 10 relative to the surface of the surface of the adhesive layer 21. Therefore, the mold body 11' can be made of a material that allows light generated by the light-emitting chip 10 to pass therethrough.

Figure 10C:
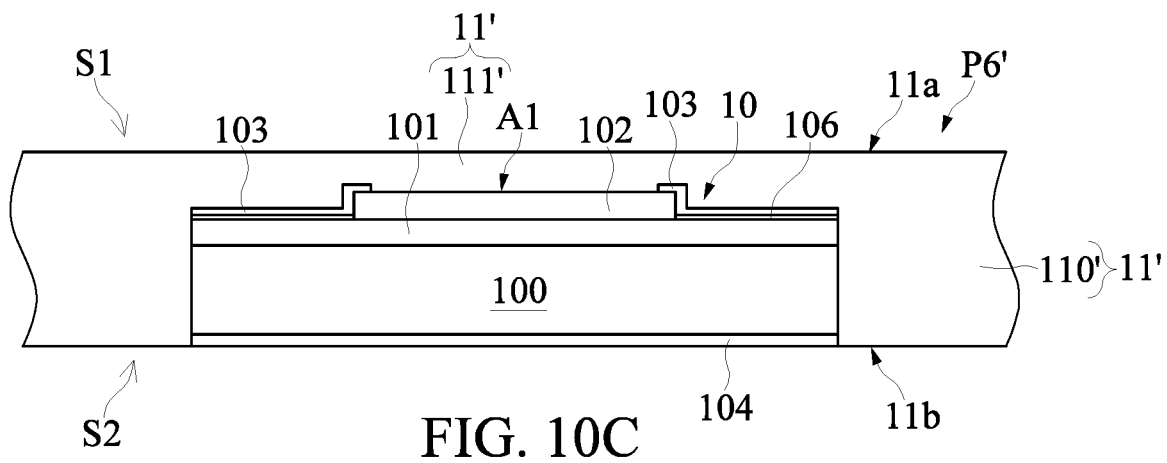
FIG. 10C is a schematic sectional view of the light-emitting chip package in one of the steps according to the embodiment of the present disclosure.

As shown in FIG. 10C, the temporary substrate 2 is removed to form an initial package structure P6'. The initial package structure P6' includes the light-emitting chip 10 and the mold body 11' covering the sidewall of the light-emitting chip 10. Accordingly, the initial package structure P6' has a light emergent side S1 and a bottom side S2 opposite thereto. In the present embodiment, the second surface 11b of the mold body 11' is coplanar with the bottom surface of the light-emitting chip 10.

Reference is made to FIG. 10D and FIG. 10E. A redistribution wiring structure 12 is formed in the initial package structure P6'. Specifically, as shown in FIG. 10D, at least one through hole H1 (two through holes H1 are shown in FIG. 10D), and at least one opening H2 (two openings H2 are shown in FIG. 10D) are formed in the mold body 11' so as to expose the first electrode 103. That is to say, the through hole H1 extends from the first surface 11a to the second surface 11b of the mold body 11', and the opening H2 extends from the first surface 11a to the first electrode 103.

As shown in FIG. 10E, the redistribution wiring structure 12 is fabricated. The redistribution wiring structure 12 includes a first interconnect wiring structure 121 electrically connected to the first electrode 103 and a second interconnect wiring structure 122 electrically connected to the second electrode 104.

The first interconnect wiring structure 121 includes a first conductive layer 121b, a first conductive post 121c, a first conductive plug 121d and a first pad 121a. The first conductive plug 121d is disposed in the opening H2 so as to be electrically connected to the first electrode 103, and the first conductive post 121c is disposed in the through hole H1. The first conductive layer 121b is disposed on the first surface 11a of the mold body 11', and horizontally extends from the first conductive plug 121 to the first conductive post 121c. Furthermore, the first pad 121a is located at the second surface 11b and electrically connected to the first conductive post 121c.

That is to say, the first electrode 103, which is covered by the mold body 11' can be electrically connected to the first pad 121a through the first conductive plug 121d, the first conductive layer 121b and the first conductive post 121c. Furthermore, in the present embodiment, the second pad 122a of the second interconnect wiring structure 122 directly covers the second electrode 104.

Accordingly, the processes of forming the redistribution wiring structure 12 further includes a step of forming a conductive material in the through hole H1 and the opening H2 to form the first conductive post 121c and the first conductive plug 121d. Subsequently, the first conductive layer 121b for electrically connecting the first conductive post 121c to the first conductive plug 121d is formed at the light emergent side S1. Furthermore, the first pad 121a electrically connected to the first conductive post 121c, and the second pad 122a electrically connected to the second electrode 104 are formed at the bottom side S2.

Figure 11:
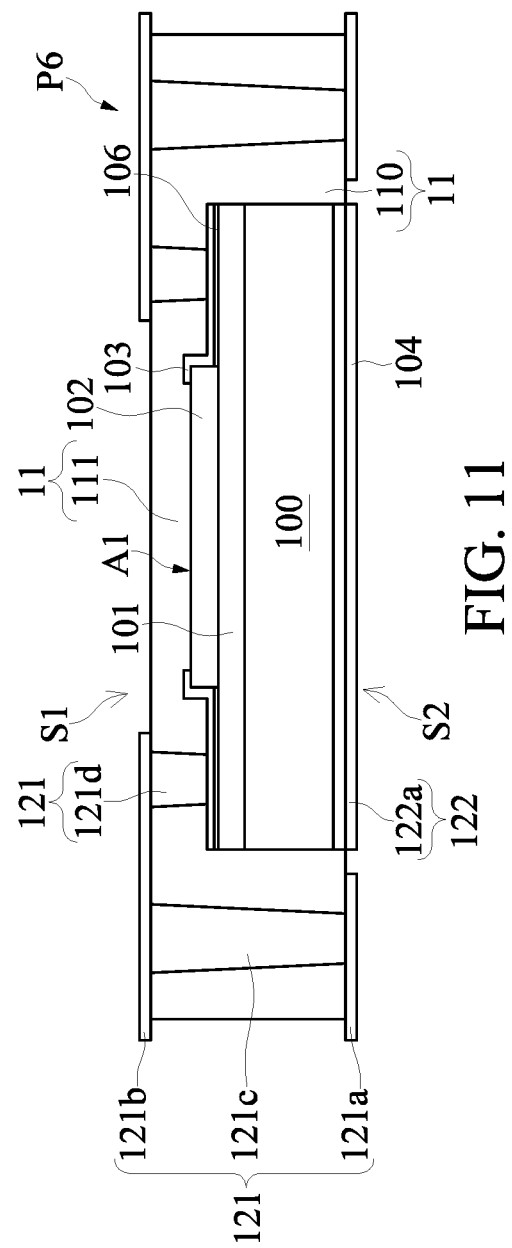
FIG. 11 is a schematic sectional view of the light-emitting chip package according to another embodiment of the present disclosure.
Figure 16:
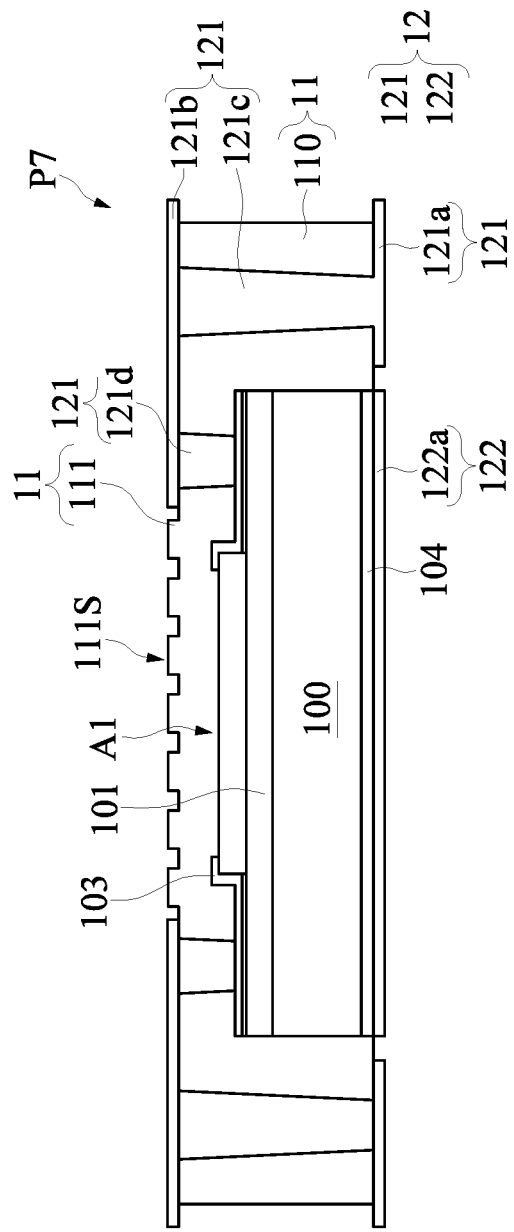
FIG. 16 is a schematic sectional view of a light-emitting chip package according to another embodiment of the present disclosure.

As shown in FIG. 10E, after the formation of the redistribution wiring structure 12, a cutting process is performed on the initial package structure P6' along a plurality of cutting lines which are defined in advance so as to form a plurality of separated light emitting chip packages P6. As shown in FIG. 11, by performing the manufacturing method of the light emitting chip package, the substrate-free and flip-chip light emitting chip packages P6 can be fabricated.

In the light emitting chip package P6 of the present embodiment, the molding compound 11 includes a surrounding portion 110 and a covering portion 111. The surrounding portion 110 encloses the sidewall of the light-emitting chip 10, and the covering portion 111 covers the emission zone A1 of the light-emitting chip 10. Furthermore, since the covering portion 111 covers the first electrode 103 of the light-emitting chip 10, the first interconnect wiring structure 121 further includes the first conductive plug 121d passing through the covering portion 111 so that the first electrode 103 can be electrically connected to the first conductive layer 121b.

It should be noted that by modifying the orientation of the light-emitting chip 10 disposed on the temporary substrate 2, the processes of the packaging method shown in FIG. 10A to FIG. 10E can also be applied to package more than one light-emitting chips 10 in the same package or to package the light-emitting chip 10 together with another passive element 13 in the same package.

During the packaging method of the embodiment of the present disclosure, different optical structures above the light-emitting chip 10 can be fabricated so that the light emitting chip package can be applied in different fields. Reference is made to FIG. 12 to FIG. 16, which respectively show schematic sectional views of the light emitting chip packages according to different embodiments of the present disclosure.

As shown in FIG. 12 to FIG. 16, the covering portion 111 of the molding compound 11 has a light emergent surface which has an optical structure 111S. The optical structure 111S can include at least one of a multi-position condensing structure, a single-position condensing structure, a light-diffusing structure, a light-enhancing structure, and an optical-grid structure.

In the embodiments shown in FIG. 12 and FIG. 13, the optical structures 111S are respectively different multi-position condensing structures. That is to say, when a beam generated from the light-emitting chip 10 emits out of the light emergent surface of the covering portion 111, the beam can be divided into a plurality of sub-beams.

In the embodiment shown in FIG. 14, the optical structure 111S is a light-enhancing structure. When a beam generated from the light-emitting chip 10 emits out of the light emergent surface of the covering portion 111, the divergence angle of the beam can be limited within a predetermined range by the optical structure 111S, such that the beam is concentrated, thereby enhancing the brightness.

In the embodiment shown in FIG. 15, the optical structure 111S is a single-position condensing structure, for example, a Fresnel lens or a condensing lens. Accordingly, when a beam generated by the light-emitting chip 10 emits out of the light emergent surface of the covering portion 111, the beam can be converged by the optical structure 111S. In the embodiment shown in FIG. 16, the optical structure 111S is an optical-grid structure so that the light emitting chip package P7 generates a single-mode beam.

Specifically, the optical structure 111S can be formed on the light emergent surface of the covering portion 111 during the formation of the mold body 11'. In one embodiment, the mold body 11' having the optical structure formed on the light emergent surface can be fabricated by injecting a molding material into a mold with a specific shape. Thereafter, the redistribution wiring layer 12 is formed in the mold body 11'. In another embodiment, after the formation of the redistribution wiring layer 12, the optical structure can be formed on the light emergent surface of the covering portion 111 by imprinting, etching, laser engraving, and so on. Furthermore, the step of forming the optical structure can be performed prior to the step S500 shown in FIG. 1.

In the abovementioned packaging method of the embodiments of the present disclosure, the optical structure 111S corresponding to a backend application can be formed above the light-emitting chip 10 during the step of packaging the light-emitting chip 10. Accordingly, it is not necessary for the light emitting chip package P7 of the present embodiment to use any additional optical element, such that the size of the electronic product can be further minimized.

In another embodiment, when more light-emitting chips 10 are packaged in the same light emitting chip package, the covering portion 111 of the molding compound 11 covers all of the emission zones A1 of the light-emitting chips 10. In this case, the covering portion 111 having the optical structure 111S can also be applied. Accordingly, as long as the optical structure 111S can be formed during the step of encapsulating the light-emitting chip 10, the number or the arrangement of the light-emitting chips 10 in the present disclosure is not limited to the example provide herein.

In conclusion, one of the advantages of the present disclosure is that in a package of a light-emitting chip or in a packaging method of a light-emitting chip, by "forming the redistribution wiring structure 12 in the molding compound 11," the flip-chip light emitting chip packages P1-P7 without any substrate can be fabricated. Compared to the conventional package structure fabricated by wire-bonding technique, each of the light emitting chip packages P1-P7 provided in the present disclosure has a smaller size.

Furthermore, in the conventional package structure fabricated by wire-bonding technique, the solder pad for bonding wires which is usually made of gold (Au) and has a specific thickness of about 1 μm to 2 μm results in higher cost. In the substrate-free and flip-chip light emitting chip packages P1-P7 of the present disclosure, the materials of the first conductive layer 121b (the second conductive layer 122b), the first pad 121a (the second pad 122a) of the redistribution wiring structure 12 can be replaced with copper, or can be a layer including a copper base coated with gold (of 0.1 μm to 0.5 μm). Accordingly, the amount of gold used can be significantly reduced so as to save the material cost.

On the other hand, compared to the conventional chip-scale package technique, since the redistribution wiring structure 12 is fabricated after the formation of the molding compound 11 in the packaging method provided in the embodiments of the present disclosure, it is not necessary to form the redistribution wiring structure at wafer lever, thereby reducing the fabrication cost.

Furthermore, it is impossible for the conventional chip-scale package technique to package chips having different sizes or functions in the same package structure. In the packaging method of the present disclosure, the light-emitting chip 10 and another chip, which respectively have different sizes or different functions, can be jointly packaged and electrically connected to each other by the redistribution wiring structure 12 according to particular implementations for broader and more flexible back-end applications.

In particular, for the light emitting chip package P7 of the embodiment of the present disclosure, the optical structure above the emission zone A1 of the light-emitting chip 10 can be directly formed during the packaging method according to particular implementations. Therefore, when the light emitting chip package P7 is applied in an electronic product, it is not necessary to use any additional optical element, such that the overall size of the electronic product can be further minimized.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting chip package having a light emergent side and a bottom side opposite to the light emergent side and comprising:
   a light-emitting chip including an emission zone, a first electrode, and a second electrode, wherein the second electrode is located at the light emergent side;
   a molding compound covering at least a sidewall of the light-emitting chip and supporting the light-emitting chip; and
   a redistribution wiring structure disposed in the molding compound, wherein the redistribution wiring structure includes a first interconnect wiring structure electrically connected to the first electrode and a second interconnect wiring structure electrically connected to the second electrode, the first interconnect wiring structure and the second interconnect wiring structure respectively include a first pad and a second pad, and the first pad and the second pad are located at the same side of the light emitting chip package;
   wherein the first pad and the second pad are located at the bottom side, and the second interconnect wiring structure further includes a second conductive layer located at the light emergent side and a second conductive post passing through the molding compound, and the second electrode is electrically connected to the second pad through the second conductive layer and the second conductive post.

2. The light emitting chip package according to claim 1, wherein the first electrode is located at the light emergent side, the first interconnect wiring structure further includes a first conductive layer located at the light emergent side and a first conductive post passing through the molding compound, and the first electrode is electrically connected to the first pad located at the bottom side through the first conductive layer and the first conductive post.

3. The light emitting chip package according to claim 1, further comprising a passive element that is encapsulated by the molding compound, wherein the redistribution wiring structure further includes a third interconnect wiring structure so that the passive element is electrically connected to the light-emitting chip.

4. The light emitting chip package according to claim 1, wherein the redistribution wiring structure further includes a conductive heat dissipation layer located at a bottom of the light-emitting chip, the conductive heat dissipation layer and the first pad are spaced apart from each other.

5. The light emitting chip package according to claim 1, wherein the emission zone of the light-emitting chip is exposed from the molding compound and is not covered by the molding compound.

6. The light emitting chip package according to claim 1, further comprising a plurality of light-emitting chips, the light-emitting chips being electrically connected to one another by the redistribution wiring structure.

7. The light emitting chip package according to claim 1, wherein the molding compound includes a surrounding portion and a covering portion, the surrounding portion encloses the sidewall of the light-emitting chip, and the covering portion covers the emission zone of the light-emitting chip.

8. The light emitting chip package according to claim 7, wherein the covering portion has a light emergent surface which has an optical structure, the optical structure includes at least one of a multi-position condensing structure, a single-position condensing structure, a light-diffusing structure, a light-enhancing structure, and an optical-grid structure.

* * * * *